United States Patent [19]

Dunham

[11] Patent Number: 4,733,137

[45] Date of Patent: Mar. 22, 1988

[54] ION NITRIDING POWER SUPPLY

[75] Inventor: Richard M. Dunham, Salisbury, N.H.

[73] Assignee: Walker Magnetics Group, Inc., Worcester, Mass.

[21] Appl. No.: 839,527

[22] Filed: Mar. 14, 1986

[51] Int. Cl.[4] .................. G05F 1/00; H05B 37/02; H05B 39/04; H05B 41/36

[52] U.S. Cl. .................... 315/291; 315/306; 315/308; 315/111; 315/21; 315/111.81; 363/17; 363/58

[58] Field of Search ......... 315/307, 308, 224, DIG. 5, 315/DIG. 7, 291, 306, 111.21, 111.81; 363/17, 58, 132

[56] References Cited

U.S. PATENT DOCUMENTS

| | | | |
|---|---|---|---|
| 3,969,652 | 7/1976 | Herzog | 315/224 |
| 3,999,100 | 12/1976 | Dendy et al. | 315/308 |
| 4,041,365 | 8/1977 | Peak et al. | 363/58 |
| 4,068,294 | 1/1978 | Anderson et al. | 363/58 |
| 4,301,498 | 11/1981 | Farrer | 363/17 |
| 4,485,434 | 11/1984 | Beeston et al. | 363/132 |
| 4,504,895 | 3/1985 | Steigerwald | 363/17 |
| 4,628,426 | 12/1986 | Steigerwald | 363/17 |

Primary Examiner—Saxfield Chatmon
Attorney, Agent, or Firm—Henry D. Pahl, Jr.

[57] ABSTRACT

In the ion nitriding power supply disclosed herein, power to the discharge chamber is normally current-regulated by a pulse-width modulated current switching device effectively in series with a switching inverter which energizes the chamber, instantaneous current variations being smoothed by a series inductance which, together with the chamber, is shunted by a freewheeling diode. Incipient arcing is quickly extinguished by semiconductor switching devices incorporated in the inverter which, when energized simultaneously, shunt the chamber, instantaneous current limiting being provided by the series inductance. The shunt switching devices are triggered when the voltage across the discharge drops below a level indicative of the formation of an arc.

10 Claims, 3 Drawing Figures 4,733,137

ION NITRIDING POWER SUPPLY

BACKGROUND OF THE INVENTION

The present invention relates to an ion implantation power supply and more particularly to a gaseous discharge nitriding system which facilitates the rapid extinction of unwanted arcing and the prompt re-establishment of desired glow discharge conditions.

As a method of nitriding metal surfaces to improve surface hardness, ion implantation is attracting increased interest. As is understood, such ion implantation can be performed by generating a glow discharge around the parts to be treated in a suitable nitrogen containing atmosphere. In order to be commercially feasible, however, such ion implantation processes must be operated at relatively high power levels where arcing may easily develop. As is understood by those skilled in the art, arcing will occur when the parts being nitrided are not perfectly clean. The impurities or pollutants present on the surface of the part being nitrided may provide a preferential point of breakdown by providing a local surface of high emissivity.

Once initiated, arcing has heretofore been difficult to control since the negative resistance characteristic of the glow discharge process requires that current limiting rather than voltage control be provided by the supply circuit powering the discharge. Rather than causing an increase in current, incipient arcing therefore tends to draw a disproportionate share of the total discharge current into a localized arc, e.g. at the dirty spot on the part or parts being treated. If this arc persists for any length of time, that point may be pitted or burned damaging the part. Further, with prior art supply systems, the speed with which the supply current can be reduced to extinguish the arc is limited and the speed with which the desired glow discharge can again be brought up to power is also relatively slow. This slowness in electrical response may in fact require that the gas pressure within the discharge chamber be temporarily reduced to permit re-initiation of the discharge, since the necessary concentration of ions for sustaining the glow discharge will have been depleted in the meantime.

Among the several objects of the present invention may be noted the provision of a novel ion implantation nitriding system; the provision of such a system which quickly extinguishes incipient arcing; the provision of such a system which facilitates rapid re-establishment of a glow discharge following a distinguishing of arcing; the provision of such a system which provides for precise control of discharge current; the provision of such a system which efficiently provides high voltage and high power levels appropriate for commercial ion implantation nitriding processes; the provision of such a system which is highly reliable and which is of relatively simple and inexpensive construction. Other objects and features will be in part apparent and in part pointed out hereinafter.

SUMMARY OF THE INVENTION

Briefly, the present invention relates to a system for powering a gaseous discharge device such as an ion nitriding chamber. Discharge current is regulated by a duty cycle modulator which is effectively in series with an inductance and a switching inverter which energizes the discharge device.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
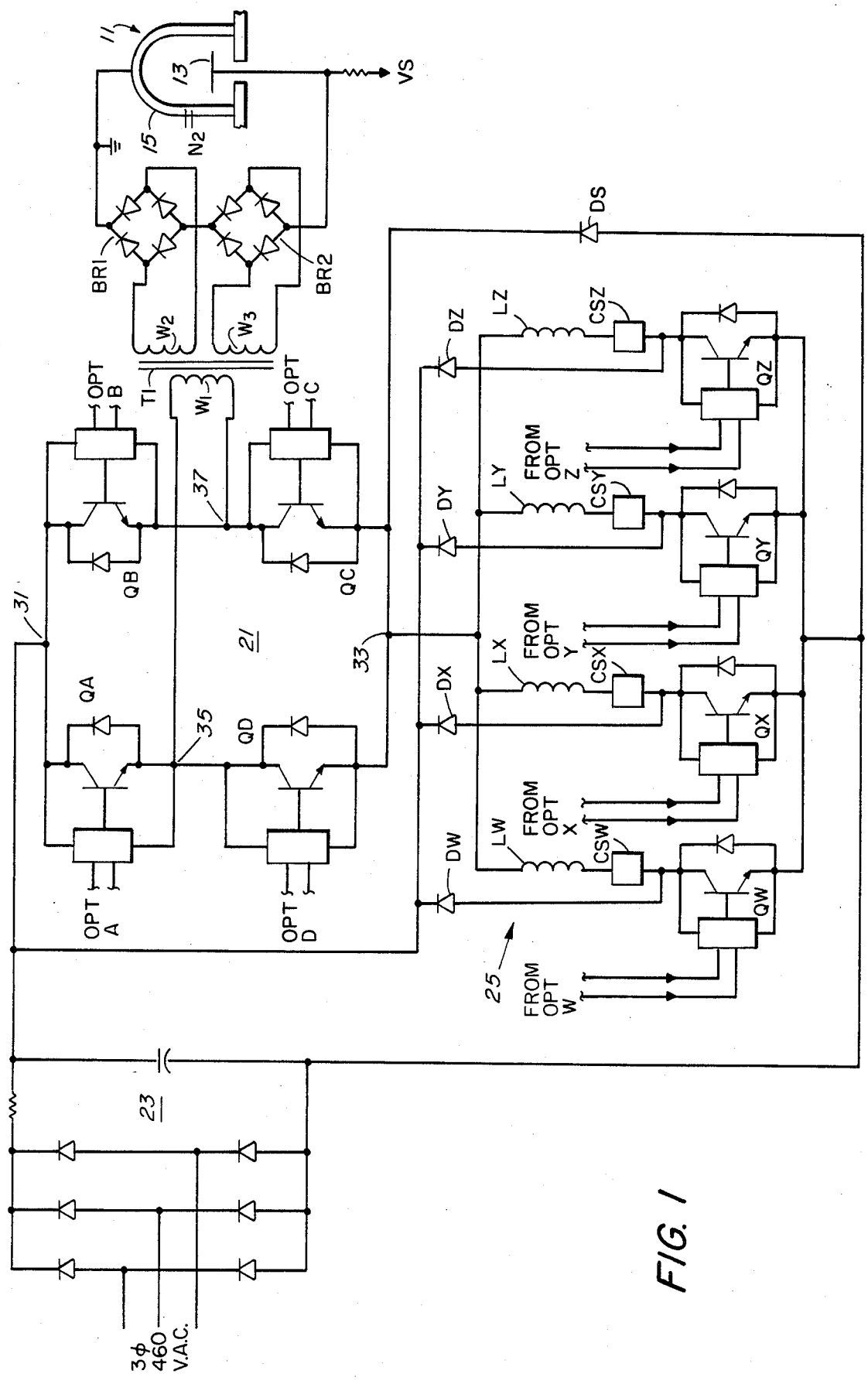
FIG. 1 is a somewhat schematic diagram of ion nitriding apparatus employing a power supply system in accordance with the present invention.

As indicated previously, the present invention relates particularly to a power supply for ion nitriding by ion implantation or glow discharge. With reference to FIG. 1, an ion nitriding chamber is indicated diagrammatically at reference character 11. As is understood by those skilled in the art, such a chamber typically comprises an insulated table or base, as indicated by reference character 13, on which metal parts to be surface hardened by nitriding are placed. A pressure vessel 15 is placed over the table with the workpieces and the chamber is filled with nitrogen gas at a suitable pressure. As is understood by those skilled in the art, a mixture of nitrogen and hydrogen may also be used.

The pressure vessel 15 is typically grounded and the chamber is energized by applying a negative voltage to the table 13. The pressure within the vessel and the energization of the chamber are preferably maintained at levels appropriate for maintaining a glow discharge around the parts to be nitrided. As is understood by those skilled in the art, the glow discharge provides ions which are accelerated toward the workpiece where they are effectively implanted in the surface and produce a surface hardening. Since it is undesirable to implant ions in the walls of the pressure vessell, d.c. energization is necessary, rather than the a.c. energization which is typically used for other glow discharge devices.

Despite its complexity, nitriding by ion implantation is preferred in some situations over more common chemical treatments since the surface texture and finish of the workpiece remain substantially unchanged except for the desired increase in hardness. As indicated previously, it is a principal function of the present invention to facilitate the maintaining of the desired glow discharges, particularly at the early stages of the usual ion nitriding process when incipient arcing may occur.

As also indicated previously, the initiation and maintaining of the desired glow discharge process requires quite high voltage and power levels, the voltage being higher than the levels typically available from supply mains. In accordance with one aspect, the power supply of the present invention employs a step-up transformer operated at a frequency substantially higher than typical a.c. supply line frequencies. For a practical supply providing approximately 50,000 kilowatts and constructed in accordance with the teachings of the present disclosure, a transformer operating frequency of about 500 hertz has been found appropriate, i.e. as compared with the usual 60 cps frequency of a.c. supply mains. As is understood, this higher frequency permits a much smaller and more efficient transformer to be employed. Such a transformer is indicated at T1 in FIG. 1.

Transformer T1 comprises a single primary winding W1 and a pair of secondary windings W2 and W3. Each of the secondary windings W2 and W3 drives a full wave bridge rectifier circuit, BR1 and BR2 respectively, the d.c. outputs of the two bridges being connected in series so that the voltages add and provide a level of voltage suitable for energizing the nitriding chamber 11. The primary winding W1 of transformer T1 is energized by means of a bridge inverter 6 which is designated generally by reference character 21 and which provides the alternating current energization of the primary winding W1 at the desired relatively high frequency, as well as certain other functions described in greater detail hereinafter. The bridge inverter circuit 21 is supplied with d.c. power from a conventional d.c. supply 23 through a current regulating circuit, designated generally by reference character 25.

Both the bridge inverter circuit 21 and the current regulating circuit 25 employ high power current switching devices for gating the current which is flowing in the primary winding of transformer T1. In FIG. 1, each of these switching devices is represented simply as a single transistor together with a corresponding optically isolated driving circuit which is indicated simply by a functional block representation. At the power levels required, however, it should be understood that the switching transistors will in fact typically comprise compound Darlington connected devices and that the driver circuits will comprise active components with optically isolated signal inputs being provided to the respective driver circuits by the control circuitry of FIG. 2 described in greater detail hereinafter. For the purposes of the present discussion, however, it is appropriate to consider that each of these devices is a switch which can be rendered conducting or non-conducting by an appropriate control signal. The switching devices making up the bridge inverter circuit 21 are designated QA-QD while the devices making up the current regulating circuitry 25 are designated QW-QZ. Each of these switching devices is shunted by a corresponding back-biased diode as is conventional when dealing with inductive loads. A representative detailed circuit of a suitable switching device is shown in FIG. 3 described in greater detail hereinafter.

While the switching devices QA-QD and QW-QZ are physically similar and are thus similarly described in this specification, different or distinguishable terms have been used in the claims in order to provide distinctive antecedents, e.g. "switch means", "switching means", "current switching device" and so forth. Thus, within each claim, a consistent distinction can be maintained corresponding to the different functions provided by these different groups of devices.

As indicated previously, the devices QA-QD are arranged in a bridge configuration to permit the current in the primary winding W1 to be reversed by selective actuation of those switching devices. In this bridge configuration, the d.c. input terminals are the junction, designated by reference character 31, which is between the devices QA and QB, and the junction designated by reference character 33 which is between devices QC and QD. Correspondingly, the a.c. output terminals of the bridge configuration are the junction designated by reference character 35 which is between transistors QA and QD and the junction designated by reference character 37 which is between devices QB and QC. To produce alternating conduction, the switching devices QA-QD are operated in pairs. Most simply stated, when transistors QA and QC only are conducting, current will flow in one direction through the primary winding and when only transistors QB and QD are conducting, current will flow through the primary winding in the opposite direction.

As is described in greater detail hereinafter, the switching devices QA-QD are driven or operated by a variable duty cycle controller so that only during a portion of each half cycle is the current flow through the primary winding W1 being driven from the d.c. supply. Unlike conventional switching inverters, however, the remainder of each half cycle is spent in a condition where all four of the switching devices QA-QD are turned on or conducting.

As indicated previously, energization of the bridge circuit 21 from the power supply 23 is provided through current regulator circuitry 25. As may be seen, the current regulator circuitry 25 comprises four similar paths in parallel. Each of the parallel legs includes, in series, one of the switching devices QW-QZ, a respective inductor LW-LC, and a respective current sensor CSW-CSZ. By means of control circuitry described hereinafter with reference to FIG. 2, each of the switching devices QW-QZ is operated in a pulse width modulated mode, though their turn-on points are staggered in time so as to effect a smoothing of the current into the bridge. The duty cycle of the respective switching devices QW-QC is controlled in response to a feedback signal obtained from the respective current sensor CSW-CSZ so as to maintain the average current level at a preselectable level. The preselected level is essentially the same for all four parallel legs so that the load is equally shared. The cathode of a respective diode DW-DZ is connected to each of the parallel legs of the current regulator circuitry between the respective inductor and the respective current switching device. The anodes of the diodes DW-DZ are connected to the positive supply lead in order to provide a so-called "freewheeling" function. In one sense, current induced in the respective inductor during the "ON" portion of the cycle of each switching device is diverted and allowed to continue to flow through the respective freewheeling diode when the switching device is turned off.

The current regulating circuit as a whole is shunted by a diode DS which prevents the junction between the bridge inverter circuit 21 and the current regulator circuit 25 from going more negative than the negative supply lead and thereby protects the circuitry from inductive impulses generated in the primary winding of transistor T1 by the switching action of the transistors QA-QD.

In the particular embodiment illustrated, the inductors LW-LC which are effectively in series with the primary winding W1 are shown as separate discrete components, it should be understood that, by utilizing a high reactance or ballast type transformer, these same inductive functions may be incorporated into the transformer itself. The embodiment illustrated, however, is the presently preferred embodiment. Similarly, while current regulation by a separate set of switching devices is presently preferred, modulation of the duty cycle of the bridge devices could also achieve current control.

Figure 2:
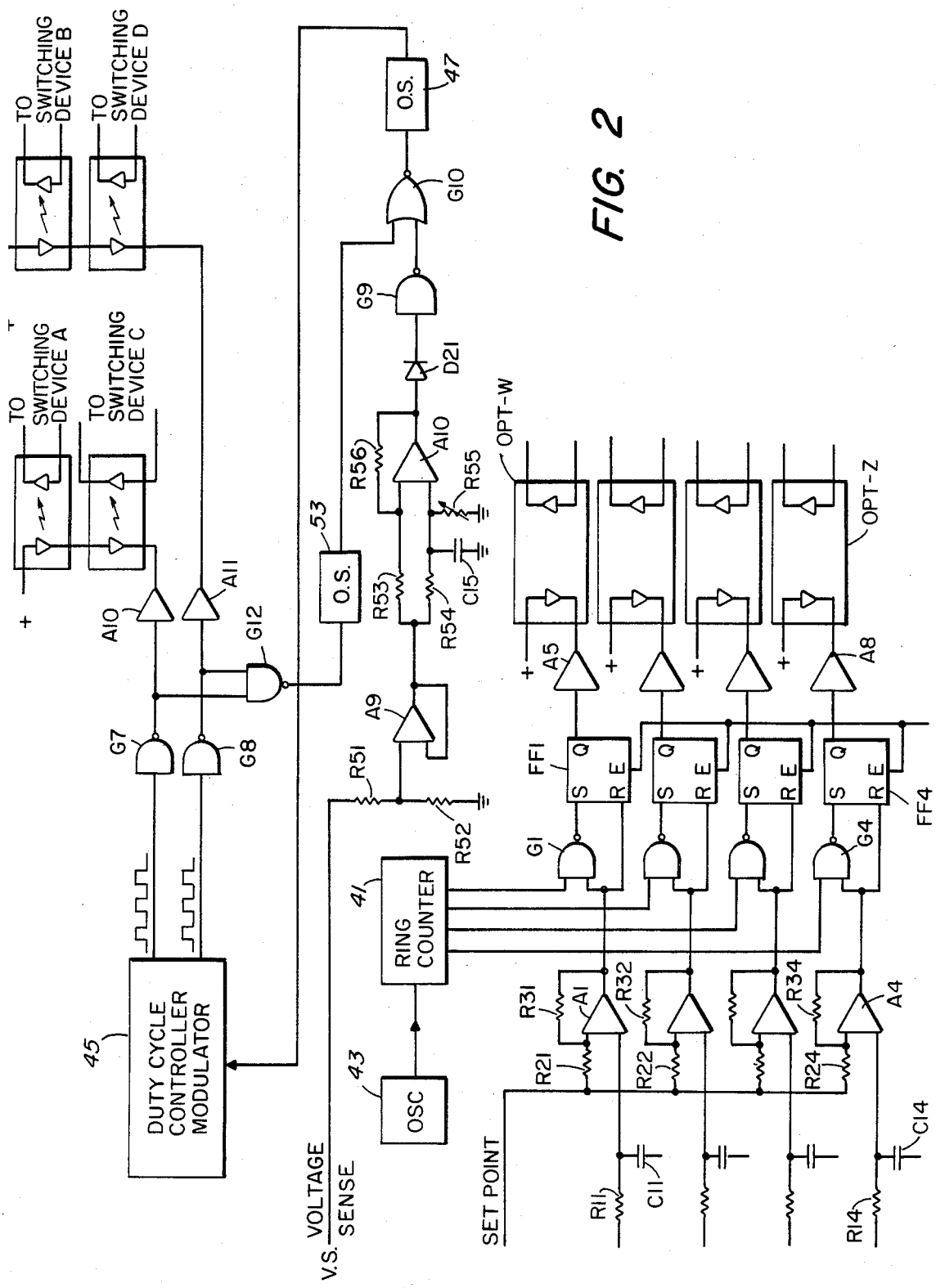
FIG. 2 is a schematic diagram of control logic circuitry for operating components of the power supply system illustrated in FIG. 1.
Figure 3:
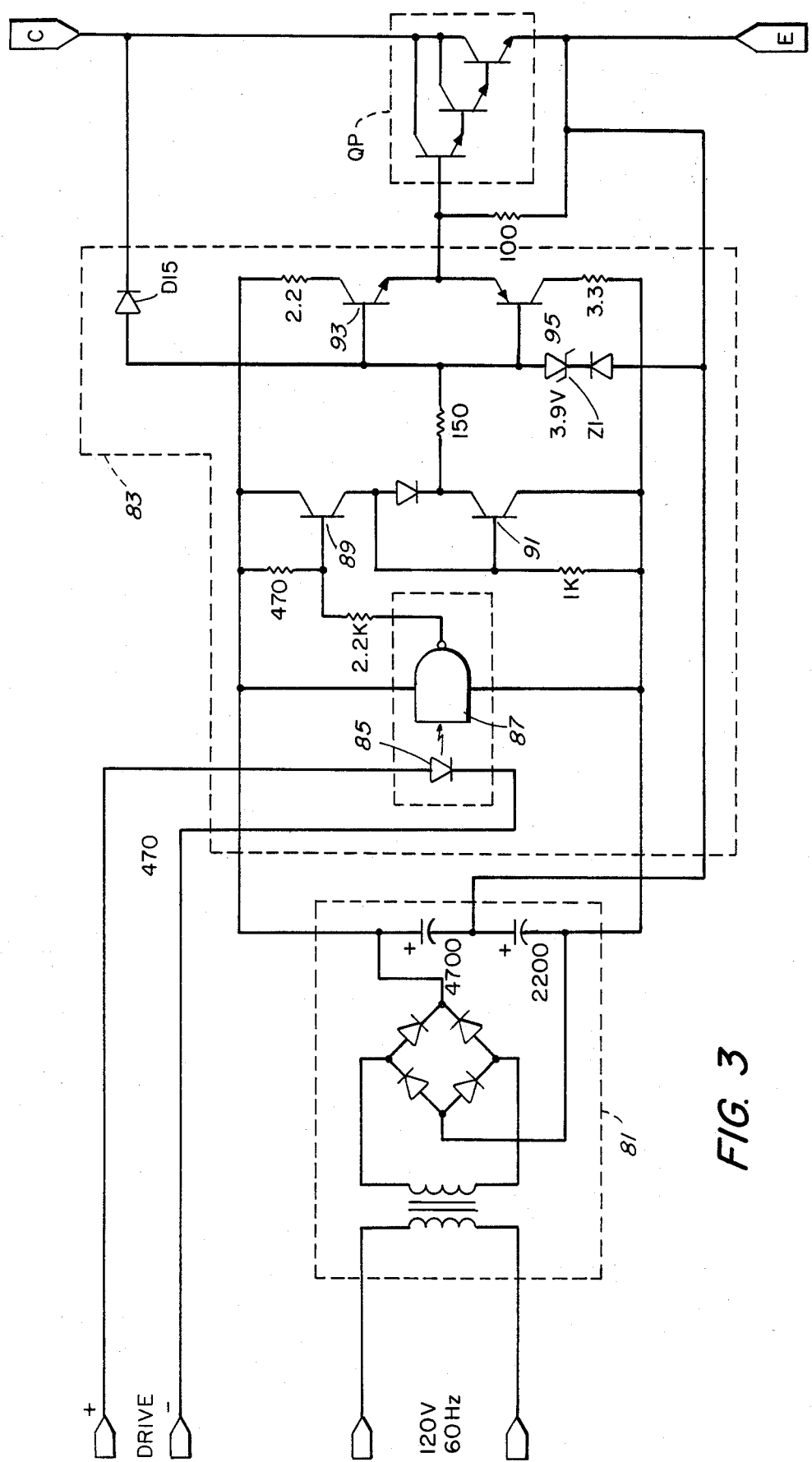
FIG. 3 is a more detailed circuit diagram of a representative one of several switching devices employed in the apparatus of FIG. 1.

Referring now to FIG. 2, the signals representing the sensed currents in each of the parallel legs, designated CSW-CSZ are applied, through respective low pass filters comprising resistors R11-R14 and capacitors C11–C14, to the inverting inputs of respective operational amplifiers A1–A4. A preselectable set point signal representing the desired level of current through each leg of the current regulator circuitry is applied to the non-inverting input of each of the amplifiers A1–A4 through a respective resistor R21–R24. The set point signal is typically an operator adjustable voltage level, e.g. obtained from a potentiometer. Regenerative feedback is provided around each amplifier A1–A4 by means of a respective resistor R31–R34 so that each amplifier operates essentially as a comparator with some hysteresis.

The output from each amplifier A1–A4, which is essentially a binary level, is provided as one input to a respective NAND gate G1–G4 and also to the reset input terminal of a respective flip-flop FF1–FF4. The other input to each of the NAND gates G1–G4 is taken from a respective stage of a ring counter 41 which is in turn driven by an oscillator 43. The output signal from each NAND gate G1–G4 is applied to the set input terminal of the corresponding flip-flop FF1–FF4.

The flip-flop circuits FF1–FF4 in turn drive, through a respective driver amplifiers A5–A8, the light emitting diodes of respective opto-isolators OPTW–OPTZ. As indicated previously, the opto-isolators OPTW–OPTZ control the energization of respective ones of the current-switching devices QW–QZ in the current-regulating circuitry 25.

Briefly, the normal operation of the current-regulating circuitry is as follows. Provided the sensed current level is below the set point, each of the current-switching devices QW–QZ is turned on at its corresponding point within the cycle of ring counter 41 since the respective signal from the ring counter will be passed through the respective NAND gate G1–G4 to set the respective flip-flop FF1–FF4. Turning on of each of the switching devices QW–QZ causes the current in the respective leg of the regulator circuitry to start to rise. When the correspondingly rising current sense signal CSW–CSZ reaches the threshold determined by the set point signal, the respective comparator amplifier A1–A4 changes state and resets the respective flip-flop. Resetting the flip-flop in turn shuts off the respective current-switching device QW–QZ.

It should be understood that this operation is to a considerable extent asynchronous since the turning off of the switching devices is not timed but rather is empirically determined. Further, under conditions of light loading of the nitriding chamber, the current in a given leg may not have dropped below the level necessary to reset the respective comparator by the time the cycle of the ring counter comes around to the respective flip-flop. In this case, the output of the comparator amplifier A1–A4 controls the respective NAND gate G1–G4 to block the signal from the ring counter so that the respective flip-flop FF1–FF4 is not set. In fact, several complete cycles of the ring counter may pass before the current drops to the appropriate levels since the current is maintained by the inductance and continues to pass through the respective freewheeling diode DW–DZ.

As indicated previously, the switching devices comprising the bridge inverter are duty cycle or pulse width control. A cyclically operating duty cycle controller is indicated in FIG. 2 by reference character 51. Controller 51 provides two output pulse trains on separate leads, as indicated in the drawings, each of which is less than a 50 percent duty cycle and which are staggered or alternating in phasing. Each of these pulse train signals is applied, through a respective inverting gate G7–G8 and a respective driver amplifier A10–A11, to drive a respective pair of the opto-isolators which control the switching devices QA–QD making up the bridge inverter.

As indicated previously, the switching devices making up the bridge inverter are paired so that QA and QC are energized together and QB and QD are energized together. However, unlike conventional switching inverters employing duty cycle modulation, the interval between when one pair is on alone and the other pair is on alone is bridged by a state in which all four devices are turned on rather than a state in which all four are turned off. As will be understood by those skilled in the art, the d.c. input circuit of the bridge inverter circuitry is separated from the low source impedance of the d.c. supply 23 by the inductors in each of the parallel paths of the current regulator circuitry 25. These inductances effectively limit the instantaneous inrush of current when all four transistors QA–QD are turned on. Also, it can thus be seen that, during normal operation, there always exists a path through the d.c. input terminals of the bridge inverter circuitry for current which is being driven by the current regulator circuitry 25, including its series inductors.

This circuit arrangement facilitates the suppression of incipient arcing which may occur in the initial stages of the nitriding process as referenced previously. Arcing is suppressed or quenched by turning on all four transistors QA–QD of the bridge inverter circuitry 21 irrespective of the state of the duty cycle controller 45. Since turning on all four bridge transistors effectively shorts the primary winding of the transformer T1, the voltage applied to the nitriding chamber is essentially immediately brought to zero, i.e. a so-called "crowbaring" action. This crowbaring action can occur quite rapidly since it is not necessary to stop the flow of current in the several inductors LW–LZ. Rather, as is explained previously, the freewheeling diodes DW–DZ provide a path linking both the inductances and the d.c. input circuit of the bridge so that this current can continue to flow, as indeed can the regulated current being provided through the switching devices QW–QZ when they are in their "ON" states.

The novel arrangement of the present invention further facilitates the rapid re-application of power to the nitriding chamber. Since the requisite current to support the glow discharge is in effect already flowing between the d.c. input terminal of the bridge, it is only necessary to divert this current flow back through the primary winding of the transformer T1 by turning off one pair of the transistors making up the bridge.

In that the energization of the nitriding chamber is current regulated, the initiation of arcing is not readily detectable by sensing the current drawn by the chamber. Rather than increasing the current drawn, the effect of arcing is to channel the current into a narrower point which can burn or pit the workpiece as described previously. Accordingly, the apparatus of the present invention senses arcing by monitoring the applied chamber voltage. This signal lead being designated VS in both FIG. 1 and FIG. 2.

The voltage sense signal VS is applied, through a resistive divider comprising resistors R51 and R52 to the non-inverting input of a follower amplifier A9. This amplifier provides essentially the same voltage signal at low source impedance and is used to drive both inputs of an amplifier A10, the amplifier A10 being operated as a comparator. One version of the buffered voltage sense signal is applied through a resistor R53 to the non-inverting input of amplifier A10 while a delayed and attenuated version of this signal is applied to the amplifier through a low pass filter comprising a resistor A54 and a capacitor C15. Capacitor C15 is shunted by a variable resistance R55 so that the degree of attenuation may be adjusted. Positive feedback around the amplifier A10 is provided by a resistor R56 so that the comparator exhibits some hysteresis. The output signal from comparator amplifier A10 drives, through a diode D21 and an inverting gate G9, one input of a NOR gate G10. The output of gate G10 in turn triggers a one-shot multivibrator 47. The output signal from the one-shot multivibrator 47 is applied to a synchronizing input of the duty cycle controller 51 described previously. The output pulse from the one-shot multivibrator essentially advances the state of the duty cycle controller and freezes its operation. Thus, at the end of the one-shot interval, the controller will resume operation and progress into the next state of energization of the bridge inverter switching devices QA-QD which directs current into the primary winding W1 of the transformer T1. The internal logic of the duty cycle controller is such that, after a synchronizing pulse is applied, the direction in which current is applied to the primary winding is opposite that which existed at the moment the one-shot was triggered. This prevents any significant d.c. component from being applied to the transformer primary winding.

As indicated previously, the signal applied to the non-inverting input of amplifier A10 corresponds essentially to the instantaneous voltage applied to the nitriding chamber, while the signal applied to the inverting input of the same amplifier corresponds to a delayed and attenuated version of the same signal. When current is applied to the primary winding of the transformer T1, the output voltage applied to the chamber rises quickly and then holds at a relatively steady level for the duty cycle of the inverter. Assuming no arc occurs, the attenuated and delayed version of this signal voltage will always be of lesser negative magnitude than the directly responsive signal until the end of the duty cycle. Accordingly, the output of the comparator amplifier A10 will normally remain low during this interval. If, however, an arc starts during this period, the voltage sense signal VS will drop quickly and will cross the delayed signal, triggering the comparator A10 and causing its output signal to go high. This transistion, passed by the gates G9 and G10, will trigger the one-shot multivibrator 47. The one-shot multivibrator 47 in turn advances the state of the duty cycle controller 45 so that all four of the switching devices QA-QD in the bridge inverter are turned on at the same time. As described previously, this action, by shunting the primary winding W1, quickly drops the voltage across the chamber. The period over which the supply output voltage is effectively "crowbarred" is determined by the timing of the one-shot multivibrator 47 and preferably it is a parameter which is operator controllable to suit the particular nitriding process being implemented.

To prevent the one-shot multivibrator 47 from being triggered at the end of the normal duty cycle, i.e. when the instantaneous voltage sense signal would inherently cross over the delayed and attenuated version, the triggering signal to the one-shot multivibrator 47 is blocked by the second input to the gate 10. This blocking signal is generated by a second one-shot multivibrator 53 which is in turn triggered by a NAND gate G12 which has, as its inputs, the two inverted signals obtained from the duty cycle controller 45. The function of this logic is to trigger the one-shot multivibrator 53 each time all four transducers in the switching devices in the bridge are turned on at the same time. As described previously, this state occurs between the alternating phases in which the reversing currents are applied to the primary winding of the transformer. Thus, this signal is appropriate for blocking the signal which is otherwise appropriate for indicating the onset of arcing.

Referring now to FIG. 3, each switching device includes a small isolated d.c. power supply 81 for powering driver circuitry 83 which operates a compound Darlington transistor QP to perform the actual high power switching function. As indicated previously, opto-isolation is provided by a light-emitting diode 85 which is optically coupled to a gate or switch 87, i.e. the gate circuit incorporates a light-sensitive transistor or diode as its input element. Gate 87 controls a first driver stage comprising a pair of transistors 89 and 91 conventionally biased to provide switch mode operation. This first pair of transistors in turn drives a second pair of complementary symmetry transistors 93 and 95 through a limiting resistor 97. Forward biasing of the transistor 95 is limited by a Zener diode Z1, further clamping during the OFF state being provided by a diode D15 connected to the collector circuit of the compound Darlington QP.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:
1. Apparatus for powering a gaseous discharge device, said apparatus comprising:
 a bridge of switching devices, said bridge having a pair of d.c. input terminals and a pair of a.c. output terminals;
 a high frequency step-up transformer, the primary of which is connected to the a.c. output terminals of said bridge;
 high voltage rectifier means for driving a gaseous discharge from the secondary of said step-up transformer;
 at least one inductor;
 at least one current switching means;
 means connecting said current switching means, said inductor and the input terminals of said bridge in series across said d.c. supply;
 at least one diode connected across said inductor and said bridge input terminals but not said current switching means for freewheeling inductive current;
 means for sensing the current drawn by a discharge fed by said high voltage rectifying means;
 means responsive to said current sensing means for pulse width modulating the conduction of said current switching means;
 means, operative in a first state for driving the switching devices in said bridge in alternating patterns of conduction phases for converting d.c. power to a.c. power at a frequency which is substantially higher than a.c. line frequency and operative in a second state for driving all of said switching devices into conduction thereby to effectively shunt said a.c. output terminals;

means for sensing the voltage across a discharge fed by said high voltage rectifier means; and means responsive to said voltage sensing means for switching said driving means from said first state to said second state if the discharge voltage drops below a level indicative of the forming of an arc.

2. Apparatus as set forth in claim 1 wherein the switching devices in said bridge are operated in pairs and wherein the means for driving the switching devices is an a.c. duty cycle controller which, in said first state, operates to turn off each pair of said switching devices during a preselectable portion of a corresponding half cycle of the controller cycle, both pairs of switching devices being conducting during the times between said portions.

3. Apparatus as set forth in claim 1 wherein said means for pulse width modulation comprises means for turning said current switching device off when the current through said series circuit rises above a preselected threshold and means for turning said current switching device on at preselected intervals provided the current through said series circuit has fallen below a second preselected threshold lower than the first said preselected threshold.

4. Apparatus for powering a gaseous discharge device, said apparatus comprising:
   a plurality of transistors interconnected in a bridge inverter configuration having a pair of d.c. input terminals and a pair of a.c. output terminals, said transistors being operable in pairs;
   a high frequency step-up transformer, the primary of which is connected to the a.c. output terminals of said bridge;
   high voltage rectifier means for driving a gaseous discharge device with d.c. derived from the secondary of said step-up transformer;
   a plurality of inductors;
   a corresponding plurality of current switching means, one for each inductor;
   means connecting each current switching means and its respective inductor in series with the input terminals of said bridge across said d.c. supply;
   a corresponding plurality of diodes, each diode being connected across an inductor and said bridge input terminals but not across the respective current switching means for freewheeling inductive current when the respective current switch means is turned off;
   respective means for sensing the current drawn through each inductor;
   respective means for turning each switching means off when the current through the respective inductor rises above a preselected threshold;
   respective means for turning each switching means on at preselected intervals provided the current through the respective inductor has fallen below a preselected threshold lower than said first;
   means, operative in a first state for driving the transistors in said bridge in alternating patterns of conduction phases for converting d.c. power to a.c. power at a frequency which is substantially higher than a.c. line frequency and operative in a second state for driving all of said transistors into conduction thereby to effectively shunt said a.c. output terminals;
   means for sensing the voltage across a discharge fed by said high voltage rectifier means; and
   means responsive to said voltage sensing means for switching said driving means from said first state to said second state if the discharge voltage drops below a level indicative of the forming of an arc.

5. Apparatus as set forth in claim 4 wherein the means for driving the transistors is an a.c. duty cycle controller which, in said first state, operates to turn off each pair of transistors during a preselectable portion of a corresponding half cycle of the controller cycle, both pairs of transistors being conducting during the times between said portions.

6. An ion nitriding system comprising:
   a high voltage supply;
   chamber means defining a gaseous discharge environment;
   at least one inductance;
   at least one current switching means;
   means connecting said current switching means, said inductance, and said chamber means effectively in series across said supply;
   means for sensing the current drawn by said chamber means;
   means responsive to said current sensing means for pulse width modulating the conduction of said current switching means to maintain said current at a preselectable value;
   at least one diode effectively connected across said inductor and said chamber means, but not across said current switching device, for freewheeling inductive current when said switching device is turned off;
   switch means for selectively shunting said chamber means;
   means for sensing the voltage across a discharge in said chamber means; and
   means responsive to said voltage sensing means for actuating said switch means to effectively short said chamber means if the voltage across the discharge drops below a level indicative of the forming of an arc.

7. A system as set forth in claim 6 wherein said chamber means is coupled to said series connecting means through a step-up transformer said switch means shunts said chamber means by shorting the primary winding of said transformer.

8. A system as set forth in claim 7 wherein said switch means comprises a plurality of transistors interconnected in a bridge inverter configuration for converting current obtained from said supply to a relatively high frequency a.c. for energizing the primary winding of said step-up transformer.

9. Apparatus for powering a gaseous discharge device, said apparatus comprising:
   a step-up transformer;
   a d.c. supply;
   an inductor;
   a bridge switching circuit comprising four current switching devices interconnected to provide reversing through the primary winding of said transformer of current obtained from said supply through said inductor, the current flowing through the primary in one direction when only a first pair of devices are turned on and in the opposite direction when only a second pair of devices are turned on;

cyclically operating duty cycle control means for turning off each pair of said current switching devices during a preselectable portion of a corresponding half of the operating cycle of said control means, both pairs of said switching devices being conductive during the times between said portions; and means operative during said portions of the operating cycle of said control means for turning all of said devices on if the output voltage drops below a level indicative of arcing.

10. Apparatus as set forth in claim 9 further comprising means for sensing the current drawn by a gaseous discharge fed by said rectifier means and means controlled by said sensing means for duty cycle modulating the current provided to said transformer primary.

* * * * *